United States Patent [19]

LaRosa et al.

[11] Patent Number: 5,289,505
[45] Date of Patent: Feb. 22, 1994

[54] FREQUENCY TRANSLATION APPARATUS AND METHOD

[75] Inventors: Christopher P. LaRosa, Lake Zurich; Michael J. Carney, Palatine, both of Ill.

[73] Assignee: Motorola, Inc., Schaumburg, Ill.

[21] Appl. No.: 806,511

[22] Filed: Dec. 13, 1991

[51] Int. Cl.$^5$ .................................. H04L 27/22
[52] U.S. Cl. ................................ 375/83; 375/86; 329/306; 455/205
[58] Field of Search ............... 375/82, 83, 86, 53; 329/304, 306, 310; 455/205, 314–316; 328/15; 377/47, 48

[56] References Cited

U.S. PATENT DOCUMENTS

| | | | |
|---|---|---|---|
| 4,922,206 | 5/1990 | Nicholas | 375/84 |
| 4,961,206 | 10/1990 | Tomlinson et al. | 375/82 |
| 5,001,724 | 3/1991 | Birgenbeier et al. | 329/304 |
| 5,049,830 | 9/1991 | Yoshida | 329/306 |
| 5,058,136 | 10/1991 | Kazecki et al. | 329/306 |
| 5,067,139 | 11/1991 | Baker et al. | 375/86 |

Primary Examiner—Curtis Kuntz
Assistant Examiner—Young Tse
Attorney, Agent, or Firm—Kirk W. Dailey; F. John Motsinger; Rolland R. Hackbart

[57] ABSTRACT

The present patent application discusses a frequency translation apparatus for altering the effective frequency of the phase information of an input signal (115). The input signal (115) has a first phase ($\theta(t)$) and a first frequency ($f_i$). The phase of the input signal is extracted and digitized at a second frequency ($f_o$), forming a second N-bit digital phase signal ($\theta'(t)$)(311). The frequency translation apparatus generates a third digital phase signal (319) which approximates the difference between $\theta(t)$ and $\theta'(t)$. Then, the frequency translation apparatus combines the second digital phase signal and the third digital phase signal, forming a fourth digital phase signal (307) substantially approximating the first phase signal.

9 Claims, 4 Drawing Sheets

FREQUENCY TRANSLATION APPARATUS AND METHOD

FIELD OF THE INVENTION

This invention generally relates to radio receivers and more specifically to frequency translation of digitized phase information.

BACKGROUND OF THE INVENTION

Typically, radio receivers include a reference oscillator. The reference oscillator is used to generate all the frequencies required to demodulate the received signal. If the phase of the intermediate frequency (IF) signal will be directly digitized, then a detector reference signal must be generated having a frequency equal to the IF; otherwise, the digitized phase signal will need to be corrected for the difference in frequencies after the digital detection. For example, assume the radio receiver has a reference oscillator of 16.8 megahertz (MHz) and an IF ($f_i$) of 456 kilohertz (kHz). Using an N-bit phase digitizer circuit operating at the reference oscillator frequency ($f_{ref}$) results in a digital detector reference frequency ($f_o$) equal to $f_{ref}$ divided by $2^N$. With a 5-bit phase digitizer circuit, the detector reference frequency would be equal to 16.8 MHz divided by $2^5$, or 525 kHz. Thus, the digital detector reference frequency ($f_o$) does not equal the IF ($f_i$). To directly digitize the phase, the IF and the digital detector reference frequency must be matched. Two solutions are currently available.

First, another reference oscillator could be used to generate a detector reference frequency equal to the IF. In the previous example, the digital phase detector would require a second reference oscillator generating a frequency of 14.592 MHz ($14.592/2^5 = 456$ kHz). Several disadvantages result from the use of the second reference oscillator. First, a non-standard frequency would require a specialized design and additional cost. Second, an additional oscillator increases the cost, size, and power consumption within the radio receiver. Third, having two unique frequencies generated within the radio receiver can potentially cause spurious interference problems. Thus, adding a reference oscillator is an undesirable solution to this problem.

A second solution to the problem involves translating the frequency of the IF signal ($f_i$) to match the frequency of the detector reference ($f_o$). This can be implemented by mixing the IF signal with a local oscillator (LO) whose frequency is equal to the difference $f_o - f_i$. Furthering the preceding example, the IF of 456 kHz would need to be mixed up such that it was equal to 525 kHz. The mixing would required an LO frequency equal to $f_o - f_i$, or 69 kHz. In addition to the extra hardware required, this solution can also cause spurious interference problems. Hence, analog frequency translation is also an undesirable solution to this problem.

Therefore, a need exists for a small, low cost, frequency translation device which does not require any additional analog hardware or create any potential spurious interference problems.

SUMMARY OF THE INVENTION

The present invention encompasses a frequency translation apparatus for altering the effective frequency of the phase information of an input signal. The input signal has a first phase ($\theta(t)$) and a first frequency ($f_i$). The first phase ($\theta(t)$) is extracted and digitized at a second frequency ($f_o$), forming a second N-bit digital phase signal ($\theta'(t)$). The frequency translation apparatus generates a third digital phase signal which approximates the difference between $\theta(t)$ and $\theta'(t)$. Then, the frequency translation apparatus combines the second digital phase signal and the third digital phase signal, forming a fourth digital phase signal substantially approximating the first phase signal.

DESCRIPTION OF A PREFERRED EMBODIMENT

The preferred embodiment encompasses a direct phase digitizer for use in a digital receiver of a radiotelephone. The direct phase digitizer uses a received signal having an intermediate frequency ($f_i$) of 456 kHz. The radiotelephone includes a reference oscillator which generates a frequency ($f_{ref}$) of 16.8 MHz. For a 5-bit phase digitizer, the effective frequency ($f_o$) is equal to $16.8 \text{ MHz}/2^5 = 525$ kHz. The phase of the IF signal is directly digitized with the detector reference frequency. The resulting raw phase word contains the desired phase ($\theta(t)$), a constant phase offset ($\phi$), and a modulo-$2\pi$ phase error ramp function ($[2\pi(f_i - f_o)t-]_{mod2\pi}$). The frequency translation apparatus generates a frequency translation word containing a modulo-$2\pi$ phase ramp function having equal but opposite slope of the phase error ramp function. The frequency translation word is input into an N-bit adder together with the raw phase word, substantially eliminating the phase error ramp function of the raw phase word.

Figure 1:
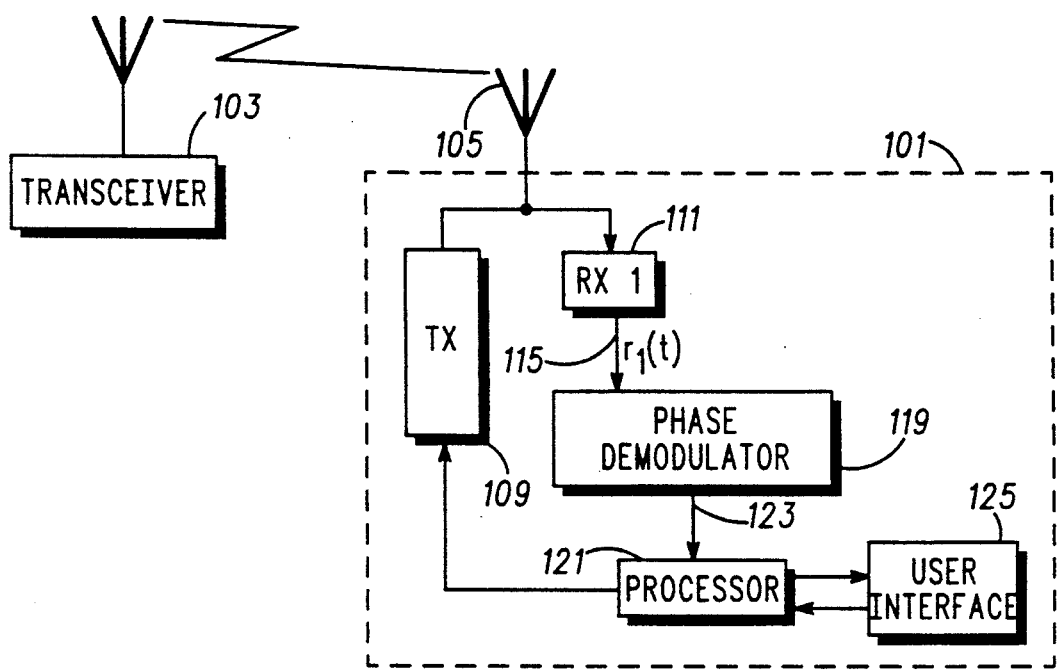
FIG. 1 is a block diagram of a radiotelephone system which may employ the present invention.

FIG. 1 is a block diagram of a radiotelephone system which may employ the present invention. In the radiotelephone system, the fixed site transceiver 103 sends and receives radio frequency (RF) signals to and from mobile and portable radiotelephones contained within a fixed geographic area served by the fixed site transceiver 103. The radiotelephone 101 is one such radiotelephone served by the fixed site transceiver 103.

While receiving signals from the fixed site transceiver 103, the radiotelephone 101 uses the antenna 105 to couple the RF signal and convert the RF signal into an electrical RF signal. The electrical RF signal is received by the radio receiver 111, for use within the radiotelephone 101. The receiver 111 generates the intermediate frequency (IF) signal 115. This signal is input into the phase demodulator 119. The phase demodulator 119 outputs a symbol signal 123 for use by the processor 121. Processor 121 formats the symbol signal 123 into voice or data for the user interface 125. The user interface 125 contains a microphone, a speaker and a keypad.

Upon the transmission of RF signals from the portable radiotelephone 101 to the fixed site transceiver 103, the voice and/or data signals from the user interface are processed by the processor 121. The processed signals are input into the transmitter 109. The transmitter 109 converts the data into electrical RF signals. The electrical RF signals are converted into RF signals and output by antenna 105. The RF signals are received by the fixed site transceiver 103.

Figure 2:
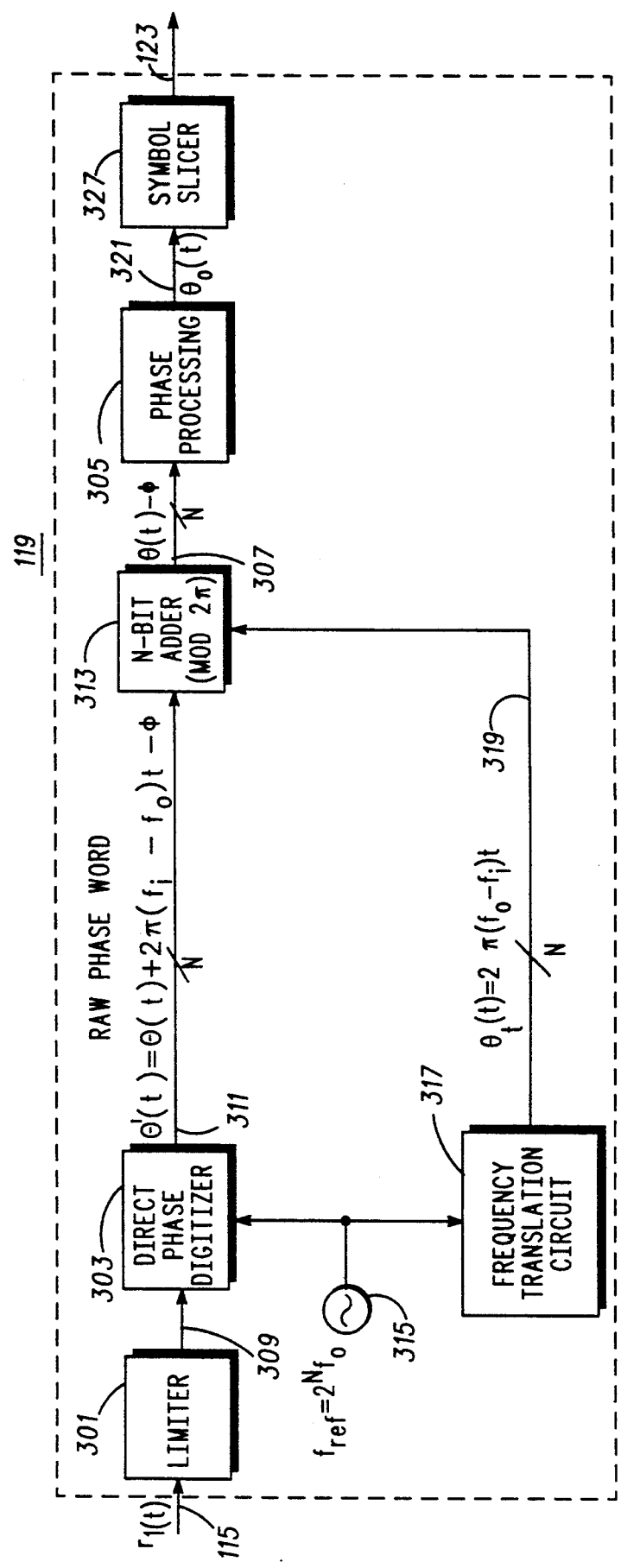
FIG. 2 is a block diagram of a phase demodulator in accordance with the present invention.

FIG. 2 is a block diagram of the phase demodulator 119 as illustrated in FIG. 1. The phase demodulator 119 includes a limiter 301, a direct phase digitizer 303, an N-bit adder 313, a phase processing circuit 305, a symbol slicer 327, a reference oscillator 315 and a frequency translation circuit 317.

The limiter 301 receives the IF signal 115 and limits the voltage range of the IF signal 115 to two voltage levels corresponding to logic 0 and logic 1. The limiter 301 outputs a limited IF signal 309. The limited IF signal 309, $$A \cos [2\pi f_i t + \theta(t)],$$

is input to the direct phase digitizer 303.

The direct phase digitizer 303 uses both the negative and positive transitions (i.e. zero crossings) of the limited IF signal 309 to sample the internally generated modulo-$2\pi$ phase ramp function. A digital estimate of the phase ($\theta'(t)$) 311 is formed by detecting the phase of the limited IF input signal 309 relative to the phase of the detector reference (c(t)).

$$c(t) = \cos [2\pi f_o t + \phi]$$

For an N-bit phase digitizer, the detector reference frequency ($f_o$) is equal to $f_{ref}/2^N$. In the preferred embodiment, $f_{ref} = 16.8$ Mhz, N=5, and $f_o = 525$ kHz. The N-bit estimated phase word $\theta'(t)$ is equal to $$\theta'(t) = [\theta(t) + 2\pi(f_i - f_o)t - \phi]_{mod 2\pi}.$$

This detected phase word ($\theta'(t)$) contains the desired phase information ($\theta(t)$), the phase error ramp function ($2\pi(f_i - f_o)t$) and the constant phase offset ($\phi$). Hence, if the intermediate frequency ($f_i$) is not equal to the detector reference frequency ($f_o$), then there will be a phase error ramp function which must be removed to ensure accurate phase interpretation.

The frequency translation circuit 317 generates a frequency translation word ($\theta_f(t)$) 319 containing a phase ramp function having a slope which is equal and opposite to the slope of the phase error ramp function, namely $$\theta_f(t) = [2\pi(f_o - f_i)t]_{mod 2\pi}.$$

The frequency translation word $\theta_f(t)$ 319 and the raw phase word 311 are input into the N-bit adder 313. The N-bit adder 313 combines the two N-bit phase words 311, 319 resulting in frequency translated phase word ($\theta(t) - \phi$) 307.

The phase signal 307 is input into the phase processing unit 305. The phase processing unit 305 removes the constant phase offset ($\theta$). The phase processing unit 305 contains either a coherent phase processor or a differentially coherent phase processor. In the preferred embodiment, a differentially coherent phase processor is used to remove the constant phase ($\phi$). The resulting digital phase signal ($\theta_o(t)$) 321 is the input to the symbol slicer 327. The symbol slicer 327 outputs the symbol decisions (data bits) corresponding to the phase signal 319.

Figure 3:
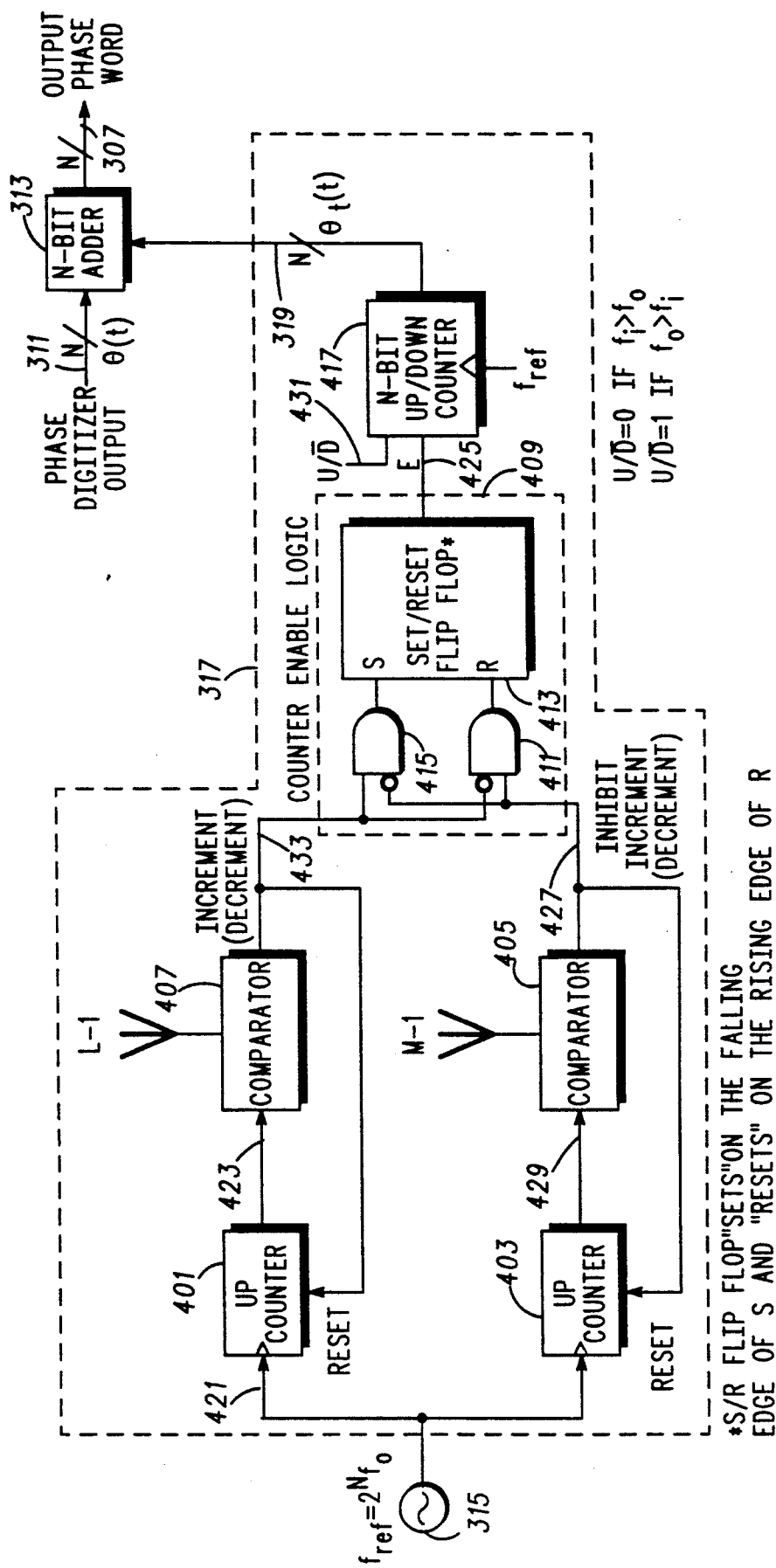
FIG. 3 is a block diagram of a frequency translation apparatus in accordance with the present invention.

FIG. 3 is a detailed block diagram of the frequency translation circuit 317 illustrated in FIG. 2. The N-bit frequency translation word 319 is generated using an N-bit up/down counter 417 clocked by the reference oscillator 315. In the preferred embodiment, the U/D input 431 of the Up/Down counter 417 is set high so the modulo-$2\pi$ phase ramp function 319 has a positive slope. If a negative slope is desired, then the U/D input 431 should be set low.

The up-counter 401 and the comparator 407 act together to divide the detector reference signal 421 by L. The reference signal 421 generated by the reference oscillator 315 drives the up-counter 401. The up-counter 401 outputs a word 423 to the comparator 407. The comparator 407 has a pre-loaded value of L-1. When the counter word 423 equals L-1, the comparator 407 generates an increment pulse 433 which resets the counter 401 and is input into the counter enable logic 409. Effectively, the increment pulse 433 goes high every L cycles of the reference oscillator signal 421.

The up-counter 403 and the comparator 405 act together to divided the detector reference oscillator signal 421 by M. The reference signal 421 generated by the reference oscillator 315 drives the up-counter 403. The up counter 403 outputs a word 429 to the comparator 405. The comparator 405 has a pre-loaded value of M-1. When the counter word 429 equals M-1, the comparator 405 generates an inhibit pulse 427 which resets the counter 403 and is input into the counter enable logic 409. Effectively, the inhibit pulse 427 goes high every M counts of the reference oscillator signal 421.

The counter enable logic 409 uses the increment pulse 433 and the inhibit pulse 427 to create a counter enable pulse 425. The counter enable pulse 425 goes high every increment pulse 433, unless an inhibit pulse 427 has occurred since the last increment pulse 433. In order for the control enable logic 409 to be effective, M must be greater than L. The counter enable logic 409 contains 2 AND gates 411, 415 and a set/reset (SR) flip-flop 413.

Each increment of the N-bit up/down counter 417 is equivalent to adding one phase sector ($\pi/2^{N-1}$ radians) every $L/f_{ref}$ seconds to the phase translation word 319. The resulting frequency translation is represented by the equation $$\Delta f = +/- f_o/L.$$

The inhibit pulse 427 further improves frequency resolution of the frequency translation word 319 by inhibiting the increment operation once every M cycles of $f_{ref}$. Including the inhibit function into the previous equation, the net frequency translation becomes $$\Delta f = +/- f_o[1/L - 1/M]$$

The frequency translation word is combined with the raw phase word 311 to yield the frequency translated phase word 307. The effective detector reference frequency after the addition of the frequency translation phase word becomes $$f_{o,eff} = f_o - \Delta f = f_o[1 - /+ (1/L - 1/M)].$$

The frequency translation parameters L and M are selected to yield the effective detector reference frequency which most closely approximates the desired intermediate frequency $f_i$. In the preferred embodiment, L=7, M=87, and the effective detector reference frequency=456.03448 kHz.

Note that both the inhibit and increment operations are not necessary for all applications. Some applications may require only the increment operation while others may require multiple inhibit operations.

Figure 4:
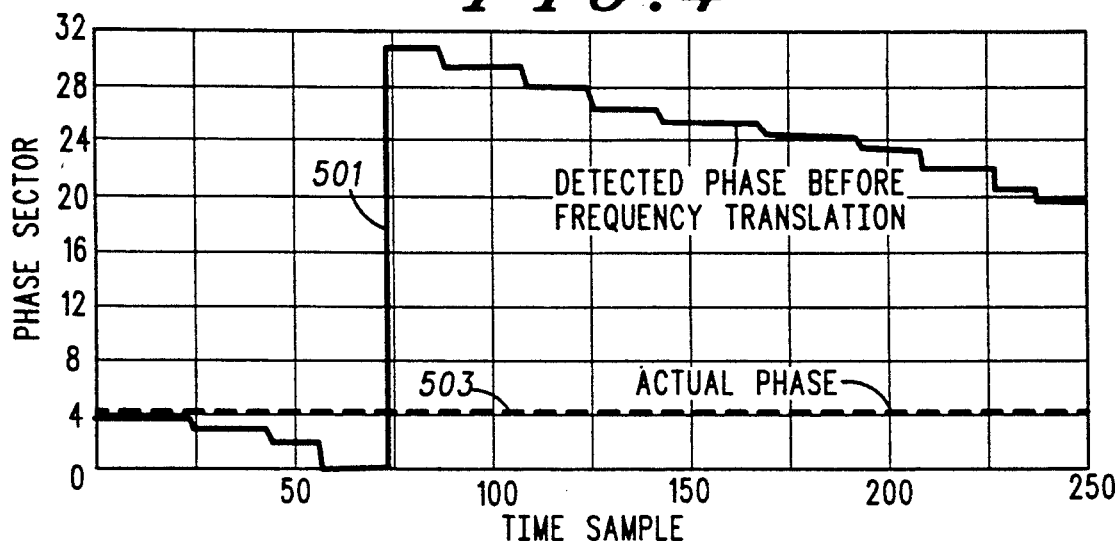
FIG. 4 is a graph of a detected phase signal prior to frequency translation.
Figure 5:
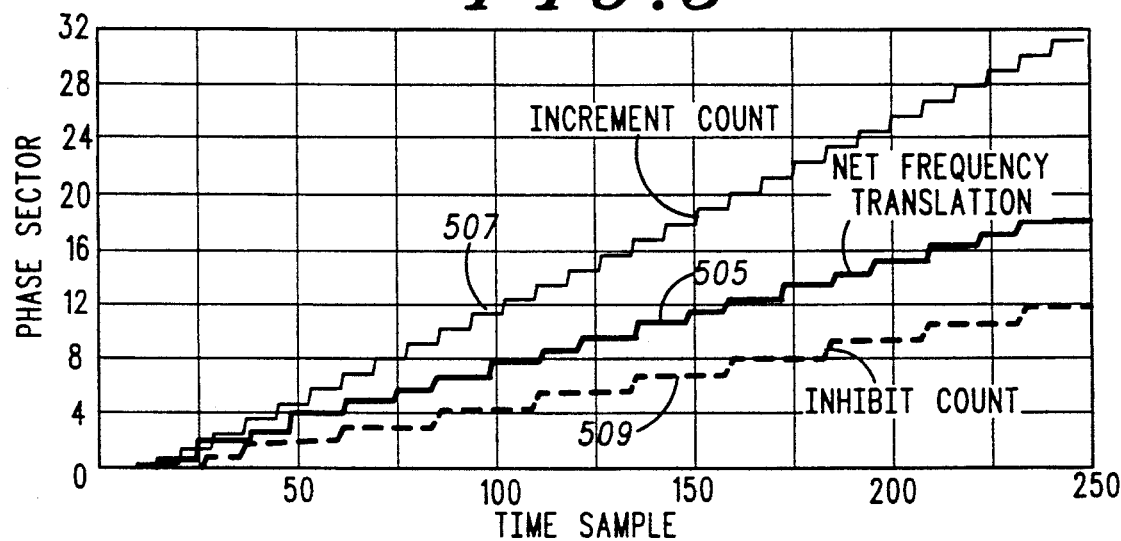
FIG. 5 is a graph of signals contained in the frequency translation apparatus.
Figure 6:
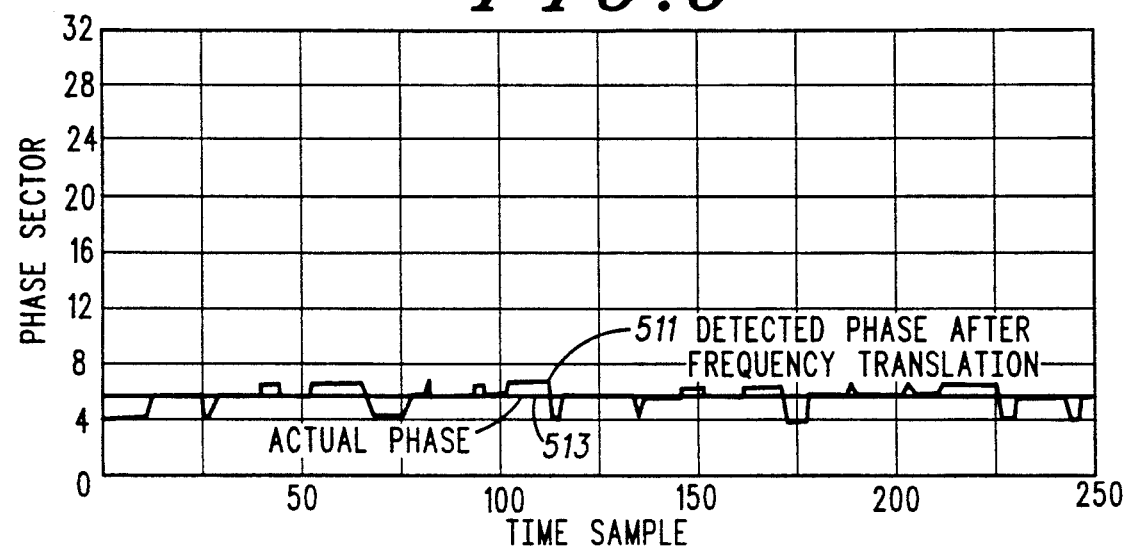
FIG. 6 is a graph of a detected phase signal after frequency translation.

FIGS. 4, 5, and 6 are graphical representations demonstrating the operation of the frequency translation circuit. FIG. 4 is a graph of the detected phase sector as a function of time. Graph 501 is a plot of the raw phase word 311 prior to frequency translation of the signal. The intermediate frequency of signal 501 was not equal to the detector reference frequency; thus, the detected phase 501 differs from the actual phase represented by the dash line 503. FIG. 5 illustrates the internal operation of the frequency translation circuit 317. Signal 507 is a representation of the number of increment pulses 433. Signal 509 is a representation of the number of inhibit pulses 427. Signal 505 represents the frequency translation word 425. The frequency translation signal 505 is a phase ramp function having a slope that is approximately equal and opposite to the slope of the detected phase signal 501. FIG. 6 is an illustration of the detected phase at the output of the N-bit adder 313. Signal 511 is a representation of the frequency translated phase word 307. Signal 513 is a representation of the actual phase of the limited IF input signal 309. Close agreement between the original phase signal 513 and the detected phase signal after frequency translation 511 is demonstrated in FIG. 6.

Described herein is an apparatus for effectively correcting a known frequency offset of a digitally detected phase signal. The offset is a result of the difference between the detector reference frequency ($f_o$) and the intermediate frequency ($f_i$). This apparatus allows direct digitization of phase information from an input signal without the addition of a second frequency source in the radio receiver. The parameters L and M are easily re-programmable so they can translate the effective frequency of the digital detector independent of the available reference frequency and intermediate frequency. This flexibility is an important feature when applying this apparatus to a radiotelephone which may have multiple applications. Additionally, the implementation is simple, low cost and effective.

What is claimed is:

1. A frequency translation apparatus for altering the effective frequency of the phase information of an input signal, the input signal having a first phase ($\theta(t)$) and a first predetermined frequency ($f_i$), the phase of the input signal is extracted and digitized at a second predetermined frequency ($f_o$), forming an estimated phase signal ($\theta'(t)$) having a second phase and containing a phase error ramp function, the frequency translation apparatus comprising:

means for generating a frequency translation signal approximating the phase error ramp function and means for combining said estimated phase signal and said frequency translation signal, substantially eliminating the phase error ramp function from the estimated phase signal.

2. A frequency translation apparatus in accordance with claim 1 wherein said frequency translation signal is equal to $+/-[2\pi f_o(1/L)t]_{mod2\pi}$, where L is a positive integer.

3. A frequency translation apparatus in accordance with claim 1 wherein said frequency translation signal is equal to $+/-[2\pi f_o(1/L-1/M)t]_{mod2\pi}$, where L and M are positive integers and L is less than M.

4. A frequency translation apparatus for use in a radio receiver operating in a system employing a phase modulation scheme, the radio receiver receives radio frequency (RF) signals having a phase and converts the RF signals to signals having an intermediate frequency ($f_i$) and a phase ($\theta(t)$), $\theta(t)$ is extracted and digitized at a second predetermined frequency ($f_o$), resulting in an N-bit second phase signal $\theta'(t)$, $\theta'(t)$ is equal to $[\theta(t)+2\pi(f_i-f_o)t-\phi]_{mod2\pi}$, the frequency translation apparatus comprising:

means for generating a third signal substantially approximating $[2\pi(f_o-f_i)t]_{mod2\pi}$; and means for combining the second phase signal and said third signal, forming a fourth signal, said fourth signal equals $[\theta(t)-\phi]_{mod2\pi}$.

5. A frequency translation apparatus in accordance with claim 4 wherein said means for generating said third signal is effectuated by incrementing the N-bit second phase signal by at least one bit every L cycles of a third predetermined frequency, where L is a positive integer.

6. A frequency translation apparatus in accordance with claim 5 wherein said means for generating said third signal is further effectuated by inhibiting said incrementing the N-bit second phase signal at least once every M cycles of a third predetermined frequency, where M is a positive integer larger than L.

7. A method of translating the effective frequency of the phase information of an input signal, the input signal having a first phase ($\theta(t)$) and a first predetermined frequency ($f_i$), the phase of the input signal is extracted and digitized at a second predetermined frequency ($f_o$) forming an estimated phase signal ($\theta'(t)$) having a phase error ramp function, the method of translating comprising the steps of:

generating a frequency translation signal approximating the phase error ramp function; and combining said estimated phase signal and said frequency translation signal, substantially eliminating the phase error ramp function from the estimated phase signal.

8. A method of translating the effective frequency of the phase information of an input signal in accordance with claim 7 wherein said frequency translation signal is equal to $+/-[2\pi f_o(1/L)t]_{mod2\pi}$, where L is a positive integer.

9. A method of translating the effective frequency of the phase information of an input signal in accordance with claim 7 wherein said frequency translation signal is equal to $+/-[2\pi f_o(1/L-1/M)t]_{mod2\pi}$, where L and M are positive integers and L is less than M.

* * * * *